(12) United States Patent
Auerbach et al.

(10) Patent No.: US 9,454,350 B2
(45) Date of Patent: *Sep. 27, 2016

(54) EXTRACTING STREAM GRAPH STRUCTURE IN A COMPUTER LANGUAGE BY PRE-EXECUTING A DETERMINISTIC SUBSET

(71) Applicant: International Business Machines Corporation, Armonk, NY (US)

(72) Inventors: Joshua S. Auerbach, Ridgefield, CT (US); David F. Bacon, Sleepy Hollow, NY (US); Perry Sze-Din Cheng, Cambridge, MA (US); Stephen Fink, Yorktown Heights, NY (US); Rodric Rabbah, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/707,235

(22) Filed: May 8, 2015

(65) Prior Publication Data

US 2015/0248279 A1    Sep. 3, 2015

Related U.S. Application Data

(63) Continuation of application No. 13/925,083, filed on Jun. 24, 2013, now Pat. No. 9,104,432.

(51) Int. Cl.
*G06F 9/45* (2006.01)
*G06F 17/50* (2006.01)

(52) U.S. Cl.
CPC .............. *G06F 8/443* (2013.01); *G06F 8/433* (2013.01); *G06F 17/505* (2013.01)

(58) Field of Classification Search
None
See application file for complete search history.

(56) References Cited

U.S. PATENT DOCUMENTS

| | | |
|---|---|---|
| 5,412,784 A | 5/1995 | Rechtschaffen et al. |
| 5,903,466 A | 5/1999 | Beausang et al. |
| 5,937,192 A | 8/1999 | Martin |
| 5,999,729 A | 12/1999 | Tabloski, Jr. et al. |
| 6,077,315 A | 6/2000 | Greenbaum et al. |
| 6,243,863 B1 | 6/2001 | Kothari et al. |
| 6,311,265 B1 | 10/2001 | Beckerle et al. |

(Continued)

FOREIGN PATENT DOCUMENTS

| | | |
|---|---|---|
| WO | 2007/085855 | 8/2007 |
| WO | 20071085855 | 8/2007 |

OTHER PUBLICATIONS

Thies, W., et al., "An Empirical Characterization of Stream Programs and its Implications for Language and Compiler Design", PACT' 10, Sep. 11-15, 2010, 12 pages, ACM 2010, <http://groups.csail.mit.edu/commit/papers/2010/thies-pact10.pdf>.

(Continued)

*Primary Examiner* — Daxin Wu
(74) *Attorney, Agent, or Firm* — Scully, Scott, Murphy & Presser, P.C.; Nidhi G. Kissoon

(57) ABSTRACT

Compile-time recognition of graph structure where graph has arbitrary connectivity and is constructed using recursive computations is provided. In one aspect, the graph structure recognized at compile time may be duplicated at runtime and can then operate on runtime values not known at compile time.

18 Claims, 4 Drawing Sheets

(56) References Cited

U.S. PATENT DOCUMENTS

| | | | |
|---|---|---|---|
| 6,330,717 B1 | 12/2001 | Raverdy et al. | |
| 6,507,947 B1 | 1/2003 | Schriber et al. | |
| 6,598,112 B1 | 7/2003 | Jordan et al. | |
| 6,651,186 B1 | 11/2003 | Schwabe | |
| 6,651,240 B1 | 11/2003 | Yamamoto et al. | |
| 6,687,760 B1 | 2/2004 | Bracha | |
| 6,745,384 B1 | 6/2004 | Biggerstaff | |
| 6,856,995 B1 | 2/2005 | Ibitayo et al. | |
| 6,981,250 B1 | 12/2005 | Wiltamuth et al. | |
| 7,051,322 B2 | 5/2006 | Rioux | |
| 7,574,692 B2 | 8/2009 | Herscu | |
| 7,756,801 B2 * | 7/2010 | Reich | H04L 67/36 700/100 |
| 7,797,691 B2 | 9/2010 | Cockx et al. | |
| 7,873,951 B1 | 1/2011 | Bissett et al. | |
| 8,001,421 B2 | 8/2011 | Wang et al. | |
| 2002/0046230 A1 | 4/2002 | Dieterich et al. | |
| 2002/0129340 A1 | 9/2002 | Tuttle | |
| 2002/0133788 A1 | 9/2002 | Waters et al. | |
| 2002/0138819 A1 | 9/2002 | Hills | |
| 2004/0006765 A1 | 1/2004 | Goldman | |
| 2004/0078779 A1 | 4/2004 | Dutt et al. | |
| 2004/0088689 A1 * | 5/2004 | Hammes | G06F 17/5045 717/154 |
| 2005/0066317 A1 | 3/2005 | Alda et al. | |
| 2005/0177817 A1 | 8/2005 | Arcaro et al. | |
| 2005/0188364 A1 | 8/2005 | Cockx et al. | |
| 2006/0041872 A1 * | 2/2006 | Poznanovic | G06F 17/5045 717/140 |
| 2006/0143596 A1 | 6/2006 | Miyashita et al. | |
| 2006/0195827 A1 | 8/2006 | Rhine | |
| 2006/0225053 A1 | 10/2006 | Lakshman et al. | |
| 2007/0003161 A1 | 1/2007 | Liao et al. | |
| 2007/0006138 A1 | 1/2007 | Ahe et al. | |
| 2007/0022412 A1 | 1/2007 | Tirumalai et al. | |
| 2007/0033659 A1 | 2/2007 | Hoche et al. | |
| 2007/0169054 A1 | 7/2007 | Cheng et al. | |
| 2008/0178149 A1 | 7/2008 | Peterson et al. | |
| 2009/0217248 A1 | 8/2009 | Bently et al. | |
| 2010/0153937 A1 | 6/2010 | Richards et al. | |
| 2011/0047534 A1 | 2/2011 | Ye et al. | |
| 2011/0055783 A1 | 3/2011 | Yang | |
| 2011/0131559 A1 | 6/2011 | Young et al. | |
| 2011/0307897 A1 * | 12/2011 | Atterbury | G06F 9/4436 718/102 |
| 2012/0044042 A1 | 2/2012 | Chan | |
| 2012/0054718 A1 | 3/2012 | Auerbach et al. | |
| 2014/0075423 A1 * | 3/2014 | Kielstra | G06F 8/443 717/155 |
| 2014/0075424 A1 * | 3/2014 | Kielstra | G06F 8/443 717/155 |
| 2015/0363175 A1 | 12/2015 | Klausner | |

OTHER PUBLICATIONS

Jagananthan, S., "Weaving Atomicity Through Dynamic Dependence Tracking", 2007 IEEE International Parallel and Distributed Processing Symposium, Mar. 26-30, 2007, 7 pages, <http://ieeexplore.ieee.org/stamp/stamp.jsp?tp=&arnumber=4228225>.

Lee, J.Y., et al., "Timed Compiled-Code Simulation of Embedded Software for Performance Analysis of SOC Design", DAC 2002, Jun. 10-14, 2002, 6 pages, ACM2002, http://delivery.acm.org/10.1145/520000/513994/p293-Lee.pdf.

Notice of Allowance dated May 5, 2016 received in U.S. Appl. No. 13/605,773, 19 pages.

Notice of Allowance dated May 6, 2016 received in U.S. Appl. No. 121870,980, 17 pages.

Office Action dated May 21, 2015 received in co-pending U.S. Appl. No. 12/870,980.

Office Action dated May 22, 2015 received in co-pending U.S. Appl. No. 13/605,773.

Office Action dated Oct. 21, 2015 received in U.S. Appl. No. 13/605,773, pp. 1-24.

Office Action dated Oct. 22, 2015 received in U.S. Appl. No. 12/870,980, pp. 1-17.

Chao et al., Denotational Data Flow Analysis For Parallel Implementation of Imperative Programs, ACM, Jan. 1, 1988, pp. 17-26.

Anonymous, Digital High Performance Fortran 90, HPF and PSE Manual, Digital Equipment Corporation, Jan. 1, 1997, pp. 1-6, http://www.mun.ca/hpc/hpf_pse/maual/h.

International Search Report and Written Opinion mailed Dec. 8, 2011 in corresponding International Application No. PCT/EP2011/063634 from the European Patent Office.

Juan Soulie, "C++ Language Tutorial" cplusplus.com, 2008, <http://www.cplusplus.com/files/tutorial.pdf> pp. 1-72.

* cited by examiner

EXTRACTING STREAM GRAPH STRUCTURE IN A COMPUTER LANGUAGE BY PRE-EXECUTING A DETERMINISTIC SUBSET

FIELD

The present application relates generally to computers, and computer applications, and more particularly to programming languages and compilers.

BACKGROUND

The end of frequency scaling has driven computer architects and developers to parallelism in search of performance improvements. Since multi-core processors can be inefficient and power-hungry, many have turned to specialized accelerators including GPUs and other architectures such as programmable architecture. For example, the importance of power dissipation makes the compilation of applications directly into reconfigurable hardware (Field-Programmable Gate Arrays (FPGAs)) a potential commercial target. Compilation of applications on a wide scale requires leveraging the skills of current software developers. But there is a large gap between the abstractions presented by high level programming languages and those used in hardware design.

Reconfigurable hardware can deliver impressive performance for some applications, when a highly static hardware design closely matches application logic. Obligated to express efficient static hardware structures, hardware designers cannot currently employ abstractions using dynamic features of modern programming languages.

BRIEF SUMMARY

A method for extracting a stream graph for a hardware circuit from a program written in a programming language, in one aspect, may comprise receiving a program. The method may also comprise analyzing the program for one or more constructs in the programming language that builds the stream graph for programming the hardware circuit. A node in the stream graph represents a computation to be performed, the computation expressed in the programming language. An edge in the stream graph represents data flowing from the node to another node in the stream graph. The method may also comprise outputting one or more artifacts representing the stream graph. The stream graph can be compiled for the hardware circuit to execute and produce a result with different node initialization values and different streaming data values that are presented in an execution of the program not known at compile time. The stream graph can be built using recursive computation and the connectivity of the stream graph can be arbitrary.

A system for extracting a stream graph for a hardware circuit from a program written in a programming language, in one aspect, may comprise a programming language compiler operable to execute on a processor and further operable to analyze a program for one or more constructs in the programming language that builds the stream graph for programming the hardware circuit, a node in the stream graph representing a computation to be performed, the computation expressed in the programming language, and an edge in the stream graph representing data flowing from the node to another node in the stream graph. The programming language compiler may be further operable to output one or more artifacts representing the stream graph. The stream graph can be compiled for the hardware circuit to execute and produce a result with different node initialization values and different streaming data values that are presented in an execution of the program not known at compile time. The stream graph can be built using iterative computation and the connectivity of the stream graph can be arbitrary.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Designs for reconfigurable hardware may involve dataflow graphs (also known as stream graphs). Each node of such graph encapsulates a computation and the nodes exchange data over wires and queues. In software, languages like Java can be used to express what should happen inside the nodes. Such languages would also be usable to express all possible connections of nodes by simply making this interconnection "executable" (delayed until runtime). However, compilation to FPGAs (in the near term) is very time-consuming and hence the graph structure should be known at compile time rather than at runtime.

A methodology and a system may be provided for design and implementation of new features in a programming language that admit construction of stream graphs of arbitrary shape using an imperative, object-oriented language. In such a programming language, a programmer may mark computations destined for hardware, and the compiler of the programming language statically checks these computations for repeatable structure. The repeatable structure may be extracted as the static structure needed for hardware synthesis.

A methodology in one embodiment of the present disclosure, may analyze deterministic computations in a programming language. An example of a programming language is Lime (Liquid Metal language). If all inputs to a deterministic computation are compile-time constant, the result of deterministic execution is repeatable. In one embodiment, a methodology of the present disclosure may apply a process of ensuring and snippet evaluation to make a stream graph structure (for hardware design) available for ahead-of-time compilation. Ensuring may include checking the stream graph construction for repeatability. Snippet evaluation (compile-time evaluation of portions of the program) may be applied to ensured stream graph construction expressions to find the necessary information to drive ahead-of-time compilation. A methodology of the present disclosure in one embodiment may also improve the kinds of stream graphs that can be extracted by relaxing the repeatability requirement so that each node of the graph can have an initialization expression that is not repeatable.

Language constructs may be provided that allow a programmer to use an object-oriented language technique to construct stream graphs, yet still allow the compiler to extract static shape information needed to compile to a reconfigurable processor (logic) such as an FPGA. The methodologies presented herein may be utilized in programming and compiling hardware, and may also be useful in other domains, for instance, which would benefit from analysis of complex static structures built with general purpose language abstraction.

Figure 1:
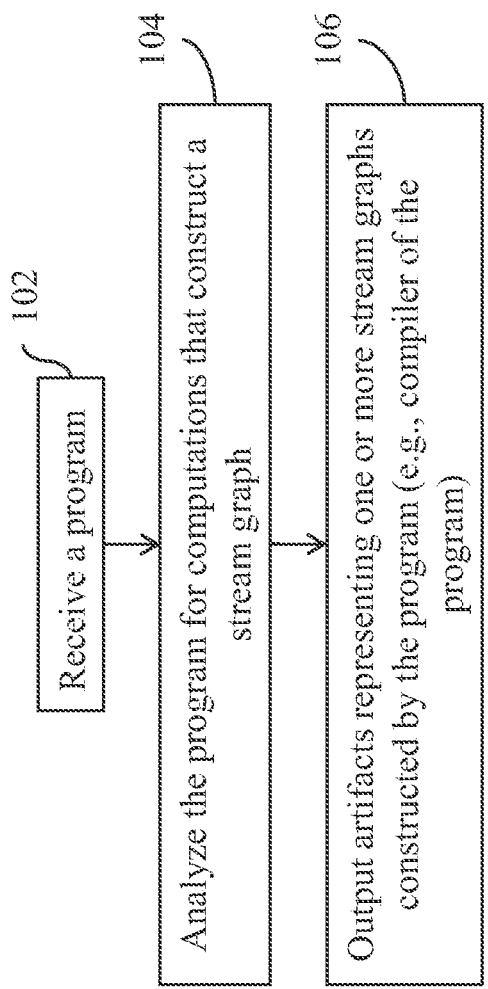
FIG. 1 is a flow diagram illustrating a method of the present disclosure in one embodiment for extracting a stream graph from a program written in a programming language.

FIG. 1 is a flow diagram illustrating a method of the present disclosure in one embodiment for extracting a stream graph from a program written in a programming language. The method may recognize a compile time graph structure wherein the graph has arbitrary connectivity and is constructed using recursive computations. Arbitrary connectivity means that any output of any node can be connected to any input of any other node that is not otherwise occupied. There is, specifically, no requirement that the graph be "planar" as in some other similar systems. A planar graph is one that can be drawn on a flat surface without any edge crossing any other edge. The graph structure recognized at compile time may be duplicated at runtime and can operate on runtime values not known at compile time. In one aspect, a node in the compile-time graph can be initialized with a value at runtime that are not known to the compiler without affecting the repeatability of the graph structure.

In a stream graph, the nodes represent computations to be performed. The edges of a stream graph are labeled and represent data flowing from one node to the next. The nodes may be given values at the beginning of execution to initialize their states (referred to as "node initialization"). Those values usually are not known at compile time. Data "streams" through the graph and comprises values not known at compile time (referred to as "streaming data values").

The programming language may have the following characteristics: the computations to be performed in the nodes of a stream graph are expressed in the programming language; the executable steps to connect the nodes to each other are expressed in the programming language and can include recursive computations; the connectivity of the graph can be arbitrary. Executable steps may include constructs of the language that can be used in a program, for example, if/then/else, do/while, subroutine calls, object constructions, etc. Those constructs may be combined in any way to form the graph.

Referring to FIG. 1, at 102, a program is received. For instance, a programmer may write recursive and iterative programs to build graphs using a computer programming language. An aspect of the present disclosure provides a support in the programming language for ensuring that graphs can be built in a deterministic and repeatable fashion.

At 104, the program is analyzed. Computations that construct the graph are evaluated and those that are repeatable are identified. For example, isolation constructs of the programming language may identify the computations that are repeatable. Those computations are executed at compile time. The techniques of analyzing the program are described below.

At 106, artifacts representing one or more stream graphs constructed by the program are output. Artifacts may include "executable program elements." For a program written to be able to run on mixed hardware, artifacts may include Java bytecodes (or the like) and native binaries to run on a general purpose processor, e.g., the main central processing unit (CPU), and "bitfiles" (as they are called) or the like to be loaded into the Field-Programmable Gate Array (FPGA) or the like reconfigurable hardware logic. The stream graphs, when compiled for suitable hardware, are capable of executing and producing a correct answer with all possible node initialization values and all possible streaming data values that may be presented in any execution of the program. The stream graph so produced, may be the same graph that would have been constructed at runtime; hence a methodology of the present disclosure in one embodiment enables a complier of the programming language to statically compile that graph for reconfigurable processor or logic such as FPGA, e.g., achieve ahead-of-time compilation of the dataflow graphs for reconfigurable targets.

An example of programmable architecture is reconfigurable hardware in the form of Field-Programmable Gate Arrays (FPGAs). Compiling a program directly into hardware eliminates layers of interpretation, which can dramatically improve performance, power, or energy consumption.

FPGA developers rely exclusively on low-level hardware description languages (HDLs) such as VHDL and Verilog. These HDLs provide low-level abstractions such as bits, arrays of bits, registers, and wires. With low-level abstractions and tools, FPGA development takes much more expertise, time, and effort than software development for comparable functions.

HDL designs derive their efficiency from hardware structures tailored to closely match application logic. The structure of a hardware design represents a dataflow graph, where each node encapsulates some behavior, and the nodes exchange data over wires and queues. An HDL design implements a data flow graph by instantiating hardware modules and explicitly connecting individual wires between modules. These hardware structures must be static—the design must fully elaborate all hardware structures at synthesis time, when tools compile an HDL design to a binary circuit representation. Synthesis often takes hours to complete, and may entail exploration of a configuration space of tuning options.

To improve programmer productivity describing data flow graph computations, several software systems provide language support for stream programming. Some streaming systems provide restricted, self-contained languages to describe data flow graphs, so that their structure can be analyzed statically. Other approaches embed operators as first-class objects in a general purpose language, without, however, enabling static extraction of their structure.

Embedding streaming constructs in a general purpose language has many advantages. Specifically, the programmer can use the full power of the language to describe stream graphs, exploiting modern language features and abstractions. For example, modern language features such as higher-order functions and parameterized types allow the developer to encapsulate design patterns in reusable libraries and software components.

However, when compiling stream graphs to an FPGA, the power of a general purpose language cuts as a double-edged sword. Modern software patterns tend to abstract and obscure structural information, which must be elaborated statically to synthesize efficient hardware.

A number of previous projects have adopted streaming programming abstractions for reconfigurable hardware. These projects require a separate compile-time language to express stream graphs often with restricted topologies. Currently, the inventors are not aware of any previous work that supports stream graphs as first-class objects in a modern, general-purpose language, and yet still can compile efficient hardware for an FPGA.

In the present disclosure, new features in a programming language (e.g., Lime, a Java-derived language) may be provided, which combine the benefits of first-class streaming language constructs with the ability to synthesize efficient hardware. In this programming language, in one embodiment of the present disclosure, stream graphs are first-class objects which can be manipulated with the full power of the language. Briefly, in programming language design, a first-class object refers to an entity that can be constructed at run-time, stored in variables and data structures, passed as an argument or parameter to a subroutine, returned as the result of a subroutine.

In general, using a programming language, the programmer may to express graphs whose structure cannot be known until run-time. However, the programmer can denote certain graph expressions for relocation to hardware, in which case the language enforces additional invariants using simple local constraints based on compositional language features. When a stream graph construction type-checks as relocatable, the language guarantees that the compiler can extract static structure needed to synthesize efficient hardware. In one aspect, a programming language/compiler co-design in the present disclosure may allow for extracting a static structure, e.g., without aggressive program analysis and without symbolic execution.

In the present disclosure, in one embodiment, the following capabilities may be provided:
- object-oriented language support is provided for first-class stream graphs: tasks and stream graphs are first-class entities in the language, allowing creation of rich structures and abstracting complex topologies into graph creation libraries;
- repeatable expressions: an extension of compile-time constancy to general expressions that admit mutable object and complex data structures. Repeatable expressions may be generalized and exploited to support extraction of static graph structure;
- relocatable task graphs: a simple syntactic construct to denote stream graphs intended for hardware acceleration. The compiler enforces type-checking constraints (based on repeatability) which guarantee that it can extract the required static graph structure for hardware;
- implementation: a compiler may implement a limited partial evaluator using Java bytecodes which is sufficient to extract graph structures built using the full feature set of the language (avoiding the need for symbolic execution or aggressive program analysis); and
- compilation into hardware: e.g., programming language sufficient to express a variety of structured graphs, and additionally can express irreducible graphs and incorporate unstructured imperative code into stream graph construction routines.

Consider a simple example: a stream evaluator for a polynomial. Given a polynomial f(x), when presented a stream of inputs $\{x_0, x_1, \ldots\}$, the program should produce the stream $\{f(x_0), f(x_1), \ldots\}$. Assume a non-functional requirement: a pipelined implementation is needed on an FPGA, which consumes and produces one value per cycle.

The following algorithm shown in Table 1 is based on Horner's rule for evaluating a polynomial:

TABLE 1

Figure 2:
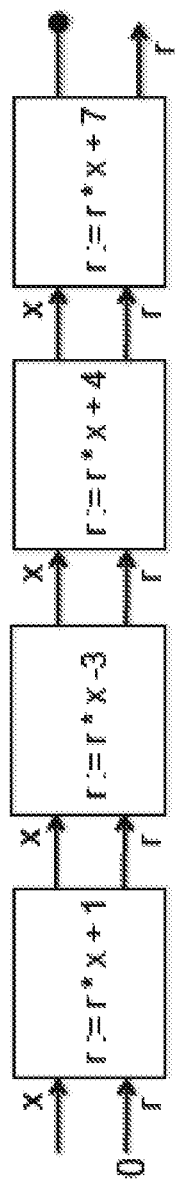
FIG. 2 shows an example pipeline to evaluate a polynomial in one embodiment of the present disclosure.

Inputs:
    an integer
    array of coefficients
Output:
Algorithm:
r = 0
for i ∈ [0,...,n]:
  r = r * x + $a_i$
return r FIG. 2 shows an example pipeline to evaluate $f(x)=x^3-3x^2+4x+7$.

Consider the polynomial $f(x)=x^3-3x^2+4x+7$. FIG. 2 shows the structure of a pipelined implementation to evaluate f(x) according to Horner's rule. Each pipeline stage performs one multiply-add, which is assumed to be synthesized in one cycle. If presented one value x per cycle, this pipeline produces one value f(x) per cycle.

The following describes how one could express this stream graph in a programming language that produces hardware code. The following description refers to the Lime programming language with reference to the methodologies of the present disclosure. However, it should be understood that the methodologies may apply to another programming language, which for example, provide similar capabilities.

Stream Graphs in Lime

Lime is based on the Java Programming Language, but adds a number of constructs to express invariants helpful when compiling programs to hardware. Here, those Lime constructs needed to understand the example above are described.

Briefly, the Lime type system includes various types that enforce immutability and restrict side effects. In one aspect, any method marked with the local qualifier has no side effects and can be considered a pure function. Additional, the Lime tuple types may be used: the syntax '(x,y,z) indicates a tuple with three elements, and the syntax '(int,int,int) specifies the type meaning "tuples of three integers". Lime supports type inference for local variables; the programmer can elide the type in a local variable declaration, and simply use "var" or "final" instead.

Lime supports a streaming dataflow programming model; a Lime program constructs a stream graph by creating tasks and composing them into an acyclic graph. A Lime program applies the task operator to a "method description" to produce a Lime task, a node in a stream dataflow graph.

The full Lime language supports a number of syntactic forms for method descriptions, which correspond to instance methods, and support object state for stateful tasks. The following describes stateless Lime tasks constructed from static methods. However, all the concepts presented in the present disclosure may translate naturally to the full Lime language, including stateful tasks.

Definition 1: (Task Construction) Let T0 Foo.m(T1, ..., Tk) be the signature of a static method m declared on class Foo, which takes parameters of types T1 through Tk, and returns a value of type T0. If all of the types T0 ... Tk are value types, then the expression task Foo.m(T1, ..., Tk) is a task construction expression.

If the signature without parameter types Foo.m is unambiguous, then task Foo.m is accepted as shorthand for the full signature.

A task construction constructs an object of type Task, which represents a node in a stream graph. The constructed task takes k inputs, whose types are T1 through Tk. If T0 is void, the task returns zero outputs. If T0 is a tuple type of cardinality m, the task produces m outputs with types corresponding to the tuple components. Otherwise the task produces one output of type T0. Each time it activates, the constructed task consumes inputs, applies the pure function represented by method m, and outputs the result.

Task is an abstract type—the language provides subclasses of Task that describe its shape. For example, class Filter <IN, OUT> extends Task is a commonly-used subtype, that describes a task that consumes an input of type IN and produces an output of type OUT. Task and all its subclasses are value types.

The program can eagerly bind (curry) one or more input arguments to a task, by specifying the bound values in the task construction expression. The curried expression is evaluated once, at task initialization time.

Definition 2: (Task Initializer) Let t=task Foo.m (T1, ..., Tk) be a valid task construction. Let e be a valid expression of type Tj for $1 \leq j \leq k$. Then the expression t' which substitutes e for Tj in t,
task Foo.m(T1, ..., e, ... Tk),
is a valid task construction. In t', e is called a task initializes. The meaning of t' is the same as t, where the value of the jth parameter is statically bound to the value of e.

Lime programs compose tasks into simple stream graphs using the connect (=>) operator. If $t_1$ and $t_2$ are tasks, the expression $t_1 \Rightarrow t_2$ describes a stream graph where the outputs of $t_1$ flow to the inputs of $t_2$.

Table 2 shows a Lime code to construct the pipeline to evaluate the polynomial $f(x) = x^3 - 3x^2 + 4x + 7$.

TABLE 2

```
static local `(int, int) ingress(int x)  { return `(x, 0); }
static local int egress(int x, int r)   { return r; }
static local `(int, int) update(int x, int r, int coef)   { return `(x, r * x + coef); }
var pipe = task ingress => task update(int, int, 1) => task update(int, int, -3) =>
    task update(int, int, 4) => task update(int, int, 7) =>
    task egress
```

The resultant pipeline matches the structure described in FIG. 2. Each instance of the update task statically binds the coef input to an appropriate integer coefficient value.

In Table 2, the structure of the stream graph, meaning its shape and the implementation of each task, is static and clearly evident from the code. When compiling to hardware, the compiler elaborates this structure statically in order to synthesize an efficient hardware design that produces one value per cycle.

Polynomial Parser

Consider another example. Suppose one wishes to write a library which can generate circuits for arbitrary polynomials, represented by strings. In software, general purpose languages support this style of library. An abstract data structure may be built that represents a polynomial, and an evaluation engine may be built which interprets the data structure at runtime. In the present disclosure, a similar library routine may be written that generates Lime stream graphs.

Returning to the example, let's represent a polynomial by an array of int, so the polynomial $f(x) = x^3 - 3x^2 + 4x + 7$ corresponds to int[ ] f={1, -3, 4, 7}. A parse method that converts a string representing a polynomial to an array of coefficients, and a method pipeline that constructs a Lime task graph from an array of integers may be built.

Table 3 sketches a simple implementation in Lime. Table 3 elides the details of the parse method, which implements basic string processing using imperative operations.

TABLE 3

| 0 | value class string {...} |
|---|---|
| 1 | static int[ ] parse(string s) {...}; |
| 2 | static Task pipeline(int[ ] coef) { |
| 3 | var pipe = task ingress; |
| 4 | for (int c: coef) { |
| 5 | pipe = pipe => task update(int,int,c); |
| 6 | } |
| 7 | return pipe => task egress; |
| 8 | } |
| 9 | int[ ] f = parse("x^3 - 3x^2 + 4x + 7"); |
| 10 | var pipe = pipeline(f); |

The Line code shown in Table 3 generates a pipeline to evaluate a polynomial represented by an array of int.

The code in Table 3 correctly expresses the necessary logic in Lime. However, in contrast to Table 2, the code in Table 3 does not minor the structure of the resultant stream graph for any polynomial. The structure of the stream graph depends on the contents of a string (line 9 ), relatively complex imperative parsing code (line 1), and a loop (lines 4-6) that constructs a task graph.

The Lime runtime system may build and interpret this task graph at runtime, running in software. When running in software, the system can construct and interpret fully dynamic graphs, at run-time. To exploit reconfigurable hardware, the compiler uses more static information. To generate hardware efficiently, the compiler may determine the structure of the stream graph at compile-time.

To determine the structure of a stream graph for the polynomial example, the compiler requires that the string (line 9) which determines the polynomial be known at compile-time. However, even when the string is known, extracting the stream graph structure from Java code in Table 3 represents a program analysis challenge. Effectively the compiler must partially evaluate the stream graph constructor for a given input, which carries all the inherent difficulties of binding-time and side-effect analysis for Java.

The present disclosure in one aspect provides for a language/compiler co-design that makes this problem tractable. Language extensions, for example, Lime language extensions may be presented to add, e.g., small but powerful, type constraints that allow the compiler to extract the relevant stream graph structure without intensive program analysis. The language may remain sufficiently general to express rich structured and unstructured stream graphs.

TABLE 4

| 0 | value class string { ...} |
|---|---|
| 1 | static local int[[ ]] parse(string s) {...}; |
| 2 | static local Task pipeline(int[[ ]] coef) { |
| 3 | var pipe = task ingress; |
| 4 | for (int c: coef) { |
| 5 | pipe = pipe => task update(int,int,c); |
| 6 | } |
| 7 | return pipe => task egress; |
| 8 | } |
| 9 | final f = parse("x^3 - 3x^2 + 4x + 7"); |
| 10 | var pipe = ([ pipeline(f) ]); |

Table 4 shows an example Lime code to construct the pipeline using the new language extensions of the present disclosure in one embodiment, e.g., similar code as in Table 3 enhanced with new Lime language constructs. The revised code may rely on the following language (e.g., Lime) concepts:

immutable arrays: The double bracket syntax (int[[ ]]) indicates an array whose contents are immutable. (lines 1, 2);

values: A class marked as a value is deeply immutable. Line 0 shows that the library class lime.lang.string is a value class. Instances of value classes and immutable arrays are called values.

local functions: A method marked as local (line 1) cannot write to mutable static data. Thus, a static method must be a pure function if the following conditions hold: i) it is local, ii) all parameters are values, iii) it returns a value.

repeatable expressions: Informally, any expression which is composed from compile-time constants, value constructors, and pure function applications is considered repeatable. The compiler can safely evaluate a repeatable expression at compile-time. In the example, the expression parse("$x^3-3x^2+4x+7$") is repeatable.

relocation brackets: An expression in relocation brackets, e.g., ([e]) defines a stream graph, intended to be executed on (i.e., relocated to) a specialized device such as an FPGA or the like. In relocation brackets, e must satisfy constraints that guarantee the compiler can extract the relevant static graph structure.

In the present disclosure, repeatability is further generalized, and relocation brackets are provided as a additional feature in the programming language.

The constraints involving relocation brackets and local methods is described in more detail below. For this example, it suffices to note that if the expression in relocation brackets is repeatable, then it satisfies the constraints. In one aspect, other scenarios may relax the restriction to increase expressive power. That aspect is also described in more detail below. In Table 4, the expression in relocation brackets at line 10 is repeatable (the type Task returned by pipeline is a value type, as is the argument, and the function is local).

In the present disclosure, language constructs are introduced which allow the programmer to write a relatively complex stream graph generating library, using all the imperative facilities of Java or the like computer language. In order to guarantee that the compiler can determine the relevant graph structure statically, the present disclosure introduces simple type constraints at the library boundary.

In one aspect, all the type constraints may be simple local properties which can be checked in a modular fashion. Compile-time evaluation of repeatable expressions would be inter-procedural and arbitrarily complicated if done by conventional means; however, the language design permits a simple concrete evaluator to run at compile-time to evaluate repeatable expressions. No complex analysis is required.

The examples codes of Tables 1-4 are shown that can use arbitrary imperative code to define stream graphs. While only a simple pipeline graph structure is presented, the same mechanisms work for all reducible graph structures, which include operators to split and join dataflow tokens.

Irreducible Graphs

The well-known FFT butterfly stream graph for the decimation-in-time FFT algorithm differs fundamentally from the graphs considered previously in many streaming languages. The FFT butterfly graph is irreducible: it cannot be expressed as a composition of pipelines, splits, and joins.

The present disclosure in one embodiment may extend a programming language (e.g., Lime) with the ability to define stream graphs with manual connections. The programmer may be allowed to construct stream graphs with an unstructured graph construction application programming interface (API), which allows arbitrary connections between tasks.

As long as the graph construction code obeys the constraints imposed by relocation brackets, the compiler can extract the relevant structure, even for irreducible graphs created through the programmatic graph API. This property holds even for recursive graph construction routines, which arise frequently in complex graph construction logic.

This facility allows a programming language (e.g., Lime) to express a richer graph language than previous streaming languages, which are restricted to reducible graphs. An enhanced programming language of the present disclosure in one embodiment can statically extract complex graph structures such as systolic arrays and FFT, and compile the graph structures to hardware.

Lime Preliminaries

The following illustrates some aspects of an example programming language that may be enhanced with the capabilities described above of building dataflows graphs for hardware during compile time, in one embodiment of the present disclosure.

Lime is a superset of Java, adding additional language features to express parallelism and locality to exploit heterogeneous architectures. Lime language features utilized in the present disclosure are reviewed below, before introducing the new language contributions in subsequent sections.

Value Types

Lime introduces a category of value types which are immutable (like the primitive types) but are declared similarly to reference types (with fields and methods). One merely adds the value modifier to a type declaration to revise the semantics and obtain additional checking to enforce deep immutability. The fields of a value type are implicitly final and must themselves be value types. For example, Lime provides the library type bit as a value enum with possible values zero and one. The primitive types inherited from Java are redefined to be value types. A special array declarator allows some arrays to be values. The type bit[] is a mutable array of bits and the type bit[[]] is an immutable array of bits (a value type).

The language defines a non-null default type for every non-abstract value type and prohibits null values for such types.

The construction rules for values prohibit cycles, so each value represents a tree that can be linearized and passed-by-value.

Local Methods

Lime introduces the local modifier on methods, which can be used to enforce invariants regarding side effects and isolation. The local modifier asserts that a method does not access mutable static fields, and only calls other local methods. Type checking these rules requires only simple intra-procedural scanning.

The rules give no general guarantee that a local method is free of side-effects, since it can modify instance fields in its receiving object or mutable objects reachable from method arguments. However, if a local method has only values as arguments and return type, then it is easy to establish that the method is pure.

Note that a local method established to be pure is not obligated to call only pure methods. It is free to call methods that are merely local, since any mutations that may occur inside those methods must be limited to objects created in the activation stack of the outermost local method. Any such mutable objects must all die before the outermost method returns, since the outermost pure method must return a value and cannot write to mutable static data structures.

Local methods are allowed to read certain static fields (if they are final and repeatable. Repeatable expressions are further described in detail below.

Stream Graphs

The Lime task constructors and task initializers, which can be used to build stream graph pipelines were introduced above. Lime also provides a set of system tasks called splitters (one input, many outputs) and joiners (many inputs, single output), which can be connected to form a rich set of possible graph structures.

The multitask constructor task $[t_1, \ldots, t_k]$ constructs a composite task having a vector of k tasks which are not connected to each other. Instead, this composite task takes a k-ary tuple as input and produces a k-ary tuple output. The ith component in the input tuple flows to task $t_i$, which produces the ith component of the output tuple.

Let $T='(t1, \ldots, tk)$ be a tuple type with cardinality k. Then the constructor task split T creates a task that consumes an input of type T, and produces k outputs, one for each component of the tuple type. A splitter task splits a tuple stream into individual streams for each component.

Let $T='(t1, \ldots, tk)$ be a tuple type with cardinality k. Then the constructor task join T creates a task that consumes k inputs, one for each component of the tuple type, and produces a tuple of type T. A joiner task creates a stream a tuples from streams of the individual components.

With connect, split, and join, Lime programs can construct any acyclic reducible stream graph shape.

Manual Graph Connections

In order to express irreducible graphs such as the FFT butterfly example described above, a programming language (e.g., Lime) is extended to support construction of arbitrary stream dataflow graphs.

TABLE 5

```
value class Task {
    Task named(string id);
}
value class TaskGraph extends Task {
    TaskGraph add(Task t);
    TaskGraph connect(Task src, int outPort, Task dest, int inPort);
}
```

Table 5 shows an API methods for the TaskGraph class, which provides a programmatic interface for stream graph construction. The TaskGraph.add method adds a task to a graph, and the connect method connects an output of one task to the input of another.

In one embodiment of the present disclosure, TaskGraph is a value class—it is deeply immutable. Thus the add and connect methods create a new TaskGraph value, and do not mutate a graph in place. The immutability of tasks plays a key role when reasoning about repeatability of task construction code, described in more detail later.

Similarly, the Task class itself is also immutable. However, in many complex graphs, such as systolic arrays, the program must build up a network which contains many copies of a particular task. In order to support this, each Task instance may have a unique string identifier. The method Task.named(string id) creates a new copy of a task, but with a different string identifier. The string identifier dictates object identity for task objects, which allows the programmer to distinguish between copies of a functional unit when building complex graphs.

TABLE 6

```
static local int twice(int x) { return 2*x; }
Task t = task twice;
Task a = t.named("a");
Task b = t.named("b");
TaskGraph tg = new TaskGraph( );
tg = tg.add(a);
tg = tg.add(b);
tg = tg.connect(a, 0, b, 0);
```

Table 6 shows program (e.g., Lime) code to build a graph equivalent to task twice=>task twice. Although this simple graph is reducible, it should be clear that a program can use the TaskGraph API to build an arbitrary graph structure.

In one embodiment, a programming language (e.g., Lime) may only accepts acyclic graphs. When the manually constructed portion of the graph is further connected using=>, the result is checked for acyclicity. In general, this will result in a run-time exception, but if the graph is being relocated, the evaluation technique presented below finds the error at compile-time.

Repeatability

Repeatable expressions in one embodiment extend the notion of constancy to arbitrary expressions.

A repeatable expression has no side effects, can be evaluated any number of times, and will always produce the same result. The class of repeatable expressions are those built from repeatable terms composed with pure functions.

Base Terms

The base repeatable terms (those containing no operations) are a superset of the set regarded as "compile-time constant" in Java. First, all literals of value types are repeatable. This includes the primitive type literals defined in Java plus the literals added by Lime for bits, ordinal types (discussed below), value enums, and string literals.

Generalizing Java's rule for constants, a simple name reference is repeatable if it is a reference to a final field or variable that has an explicit repeatable initializer. A qualified name reference (like Foo.a) is repeatable if it is a reference to static final field that has an explicit repeatable initializer.

Built-in Operators

A programming language (e.g., Lime) includes a set of built-in operators which represent pure functions. (e.g., +, −, *, %, /). If expression e has a pure operator applied to arguments that are all repeatable, then e is repeatable.

User-Defined Functions and Types

In one embodiment of the present disclosure, the set of repeatable expressions may be increased with two capabilities not supported for constants in Java. First, the local invariants may be exploited to reason about calls to user methods that must be pure functions. So, a method invocation produces a repeatable result if the method is pure and all of its actual arguments are repeatable.

Second, a value creation (with the new operator) may be regarded as repeatable if the constructor is pure and all the actual arguments are repeatable.

If e is a repeatable expression, and evaluation of e terminates, then e evaluates to the same value in all possible executions. This can be shown by structural induction over the forms of repeatable expressions.

Ordinal and Bounded Types

When compiling to an FPGA or the like reconfigurable logic, the generated design must fit in limited physical resources, and cannot exploit a virtual address space. For this reason, the compiler should often be able to compute the size of arrays at compile-time, in order to use scarce logic resources efficiently.

To help the compiler reason about array sizes, a programming language (e.g., Lime) may include bounded array types. Informally, the type "int[[N]]", where N is an integer, represents an array of exactly N integers. More generally, Lime supports ordinal types, where the type "ordinal N" represents the set of non-negative integers i where i<N. Lime programs can use ordinal types just like any other types in Java; in particular they can be used as type parameters to generic methods. Additionally Lime supports restricted constructs to convert between ordinal types and integer values, so ordinal types represent an extremely limited form of dependent integer types. The rules for repeatability for integer values extend naturally to define repeatability for ordinal types and type parameters. With repeatable ordinal types and generics, the Lime programmer can build task graphs recursively to express divide-and-conquer algorithms for arrays.

TABLE 7

| | |
|---|---|
| 1 | local static <ordinal N> int[[N]] sort(int[[N]] input) { |
| 2 | if (N.size > 1) { |
| 3 | final int HALF = N.size/2; |
| 4 | int[[HALF]] low = lowerHalf(input); |
| 5 | int[[HALF]] high = upperHalf(input); |
| 6 | low = MergeSort.<HALF>sort(low); |
| 7 | high = MergeSort.<HALF>sort(high); |
| 8 | return merge(low,high); |
| 9 | } else { |
| 10 | return input; |
| 11 | } |
| 12 | } |
| 13 | local static <ordinal N, ordinal M> int[[M]] merge(int[[N]] a, int[[N]] b) { ... } |
| 14 | final int[[8]] a = {4, 6, 2, 8, 9, 4, 3, 12 }; |
| 15 | final b = sort(a); |

Table 7 sketches a recursive implementation of merge sort, using ordinal type parameters. The type parameter N (line 1) indicates the size of the input array. Note that the code constructs a new ordinal type HALF, used in the divide and conquer recursion.

Observe that the type system ensures that sort is a pure function. Thus, when sort is invoked on a repeatable input (line 15), the type system ensures that all type parameters used in the recursive expansion of sort are also repeatable. Thus, the compiler can statically determine the bounds of all arrays used in the call to sort at line 15. Furthermore, since sort is pure, the result b at line 15 is also repeatable and can be computed at compile-time.

Although Table 7 shows simple single-threaded code, the same concepts apply when onstructing stream graphs from generic methods with bounded array inputs and outputs. This pattern arises frequently in stream graphs for Lime programs on FPGAs. Repeatable bounded array types are a key feature in being able to statically bound space usage in hardware designs for complex stream graphs.

Repeatability Issues

Termination

Lime provides no guarantee that a repeatable expression will terminate without throwing an exception, or even terminate at all. However, the behavior (terminating or not) will be reproducible, and can be monitored at compile-time. When the compiler evaluates repeatable expressions, it checks for exceptions and imposes a time out. Should evaluation not terminate normally in a reasonable interval, the compiler reports the failure as a compile-time error.

Determinism

Invariants for local methods and constructors guarantee freedom from side-effects, but not necessarily determinism. It may be assumed that such methods cannot contain any non-deterministic operations. This assumption is true today in Lime, because Lime has no core language constructs that are non-deterministic. The type system prevents local methods from calling native code or across a foreign function interface.

Generalizing Repeatability

The current definition of repeatability includes two pragmatic compromises. First, it may be insisted (as with Java compile-time constants) that any final fields must first have an explicit initializer before it is considered whether that initializer is repeatable. Second, qualified names like Foo.a may be limited to the case where they denote a static field. It may be possible to relax both restrictions.

Relocation Expressions

The following describes the language constructs in one embodiment of the present disclosure that guarantee that the compiler can extract static information about stream graphs, needed in order to relocate a stream graph computation from software onto an FPGA.

Relocation Expressions

If e is a language (e.g., Lime) expression, the syntax ([e]) is introduced, which is called a relocation expression, using "relocation brackets" syntax.

A relocation expression type-checks whether a) e is repeatable, or b) e satisfies additional constraints specific to unrepeatable task initializers (Definition 2) for stream graphs. Each case is discussed below and the additional constraints which define case b) are explained.

If e is a relocation expression which generates a stream graph, then the compiler guarantees that it can extract static structural information (hereafter called stream graph structure) sufficient to enable hardware synthesis.

Definition 3 (Stream Graph Structure) Let g be an object of type Task (i.e., a stream graph). A stream graph's structure may comprise:

1. the topology of the graph, a canonical form of its nodes and connections,
2. for each edge, the type of all values that flow on it,
3. for each node, the Lime method providing its behavior, and
4. for each method parameter of the previous, whether or not it is curried (i.e., constructed via a task initializer as per Definition 2).

For part 4 above, the actual value bound to the parameter is not considered part of graph structure in one embodiment of the present disclosure. Therefore, the stream graph structure does not completely determine the function to be executed in each node. The "code" is determined by part 3 above, the curried signature is refined by part 4, but the task initializers (see Definition 2) are still unknown.

Repeatable Stream Graph Expressions

When a stream graph expression is repeatable, the compiler can fully evaluate the expression, and walk the resultant data structure to determine the graph structure. Implementation details in one embodiment of the present disclosure relating to the compile-time repeatable graph evaluator is described below. An example of a repeatable graph is illustrated in the polynomial example described above.

Tasks are designed as immutable values, allowing to reason about repeatability for library methods that produce and consume Task objects.

As a simple example, consider:

static local Task connect(Filter<int,int>a, Filter<int,int>b) {return a=>b;}

If one wants to use connect in a repeatable (or relocatable) expression, then the type system must establish that connect is a pure function. Recall that there is this guarantee for local methods that produce and consume values. Thus Lime Task objects are deeply immutable.

Unrepeatable Task Initializations

In a pipelined implementation for polynomial evaluation described above, the degree and coefficients to the polynomial were static. In this case, both the stream graph structure and all the task initializers are repeatable, so all the node functions were completely determined. However, a methodology in one embodiment of the present disclosure can also efficiently support hardware stream graphs where the stream graph structure is repeatable, but the functions of individual nodes in the graph depend on dynamic data provided through unrepeatable task initializers. The present language extensions to support this are now described.

Consider a variant of the polynomial pipeline for functions of the form $f(x)=a_0x^3+a_1x^2+a_2x+a_3$, where the degree of the polynomial is fixed at 3, but the coefficients of the polynomial are unknown at compile-time.

Intraprocedural Case

Table 8 shows a program (Lime) code to build a stream graph for this problem. In this case, it is assumed that the coefficient array a is not repeatable.

TABLE 8

Lime code to construct a pipeline to evaluate a 3rd-degree polynomial $f(x) = a_0x^3 + a_1x^2 + a_2x + a_3$, where the coefficients $a_i$ are not repeatable. Refer to Table 2 for definitions of update, ingress, and egress.

```
int[4] a = readFromInput( ); // assumed dynamic
var pipe = ([ task ingress =>    task update(int, int, a[0]) =>
                                 task update(int, int, a[1]) =>
                                 task update(int, int, a[2]) =>
                                 task update(int, int, a[3]) =>
                                 task egress])
```

The relocated expression in Table 8 is not repeatable. To allow this expression to type-check, the type-checking rules may be relaxed.

For the moment, consider the subset of Lime which excludes procedure calls.

Definition 4 (Relocatable Expressions (no calls)). A (legal) Lime expression e is relocatable if and only if one of the following holds:
1. e is repeatable
2. e is of the form task M.foo(p1, . . . , pk),
3. e is of the form e1=>e2 where both e1 and e2 are relocatable
4. e is of the form task [e1, . . . , ek] where each expression $e_i$ is relocatable,
5. e is of the form split e1 or join e1, where e1 is relocatable
6. e is of the form e1.add(e2) where both e1 and e2 are relocatable
7. e is of the form e1.connect(e2,e3) where e1, e2 and e3 are relocatable Case 2 allows a relocatable expression to use unrepeatable expressions as task initializers (recall Definition 2.1). This case allows the stream graph in Table 8 to type check as relocatable. Specifically, the unrepeatable coefficients a[i] appear only inside expressions of the form task e.

This definition of relocatable constrains the code such that the stream graph structure is repeatable, but the logic that implements each user task in the graph can use runtime values. The system can implement this pattern efficiently in hardware by laying out the stream graph statically, and laying down wires to route the dynamic values to the appropriate functions at runtime.

Interprocedural Case

Next, the definition of relocatable expressions may be extended to support procedure calls, so stream graph constructions can be encapsulated in a library, even when they employ unrepeatable values as task initializers.

Table 9 shows the library method encapsulation for the running example. Note that the expression in relocation brackets at line 10 now contains a procedure call.

TABLE 9

Lime code to construct a pipeline to evaluate a 3rd-degree polynomial $f(x) = a_0x^3 + a_1x^2 + a_2x + a_3$, where the coefficients $a_i$ are not repeatable. Refer to Table 2 for definitions of update, ingress, and egress.

```
1   static local Filter<int,int> thirdDegree(task int a0, task int a1,
2                                            task int a2, task int a3) {
3       return task ingress =>    task update(int, int, a0) =>
4                                 task update(int, int, a1) =>
5                                 task update(int, int, a2) =>
6                                 task update(int, int, a3) =>
7                                 task egress;
8   }
9   int[4] a = readFromInput( ); // assumed dynamic
10  var pipe = ([ thirdDegree(a[0], a[1], a[2], a[3]) ]);
```

In one embodiment, additional type qualifiers are added that pass constraints about relocatable expressions across procedure boundaries, but still allow modular local type checking. In one embodiment, the task keyword may be re-used for this purpose—allowing the task keyword as a type qualifier on formal parameters (lines 1 and 2 in Table 9).

When a task qualifier decorates a formal parameter p of a method m, p is called a dynamic parameter. In one embodiment of the present disclosure, there may exist only two legal ways p can appear in expressions inside m:
1. In an expression task M.foo(p1, . . . pk), a dynamic parameter p can appear as a bound value for a task initializer pj.
2. p can be used as the actual parameter in a call, where the corresponding formal parameter q in the callee is a dynamic parameter.

Any other use of p may fail to type check in one embodiment of the present disclosure.

In Table 9, each formal parameter of thirdDegree is dynamic, but the method type checks because all uses of formal parameters in the procedure satisfy condition 1.

Definition 5 (Relocatable procedure calls) A procedure call expression M.foo(p1, . . . , pk) is relocatable if and only if for each j, $1 \leq j \leq k$,
   pj is repeatable, or
   the jth formal parameter of M.foo is a dynamic parameter.

In one embodiment of the present disclosure, an expression e may be defined to be oblivious if, during the evaluation of e, every conditional expression evaluated is repeatable. If an expression is oblivious, then its evaluation will follow the same control flow branches in every possible environment.

In one embodiment of the present disclosure, all relocatable expressions may be oblivious. This property is simple to establish with structural induction on the shape of relocatable expressions. If a relocatable expression is repeatable, it is oblivious. Otherwise, it suffices to note that in each syntactic form listed in definitions 4 and 5, no unrepeatable values can affect control flow.

Next, a key property in one embodiment of the present disclosure may be established that allows the compiler to extract the shape of relocatable expressions without aggressive program analysis.

Repeatable Structure Property. Suppose a call expression e=M.foo(e1, . . . p, . . . ek) is relocatable, where all actual parameters except p are repeatable, and p corresponds to a dynamic parameter of M.foo of type T. Assume the evaluation of e terminates without an exception, producing the stream graph object $g_1$. Now let e2=M.foo(e1, . . . , p2, . . . ek) be the expression e, substituting any value p2 of type T for p. Then evaluating e2 terminates without an exception, producing a stream graph object $g_2$. Furthermore, $g_1$ and $g_2$ have the same stream graph structure.

Informally, this property may be established with an argument based on information flow. The body of M.foo may be considered as a function with k inputs, where the ith input $in_i$ is the dynamic parameter corresponding to actual parameter p. In one embodiment of the present disclosure, the type checking rules for dynamic parameters guarantee that no statement in M.foo can be control-dependent on $in_i$, and only task constructions can be data dependent on $in_i$. Thus the effects of in, on the object resulting from evaluating either e1 or e2 must be confined to task constructions. Thus the stream graph structure must be repeatable.

This key property allows a system of the present disclosure to evaluate relocatable expressions that produce stream graphs at compile-time, substituting place-holders during evaluation for any dynamic parameters. The structure of the resultant stream graph does not depend on dynamic parameters—instead, dynamic parameters may only flow untouched to task initializers. With this property, the compiler can establish the stream graph structure for relocatable graphs with a relatively simple concrete evaluator, which is described below.

Nested Task Graphs: in Table 9 the method thirdDegree is also decorated with a task qualifier. This qualifier adds additional constraints—in particular, a task method can only execute a certain restricted class of task graphs that are isolated and deterministic. These restrictions allow the Lime program to execute task graphs while evaluating expressions that construct task graphs, without losing the benefits of relocatable expressions. The constraints imposed by the task qualifier may be a superset of constraints imposed by local.

Implementation

The following describes implementation factors associated with design of compiler support to extract graph structure in one embodiment of the present disclosure. Considerations associated with repeatable expressions are presented, and then considerations associated with partial evaluation for relocatable expressions with unrepeatable sub-expressions are presented.

In a functional language which represents programs as values, a repeatable expression evaluator would not be challenging (e.g., eval e in Lisp). However, a programming language considered in the present disclosure (e.g., Lime), e.g., an imperative language based on Java, does not represent programs as values. Like a Java compiler, the Lime compiler generates JVM bytecodes. So, the compiler can employ the JVM to evaluate repeatable expressions at compile-time.

Namely, a compiler of the present disclosure in one embodiment generates bytecode representations of repeatable expressions called snippets. The snippet evaluator implementation considers the following design factors:

1. How to manage the Java virtual machine runtime environment when running the snippet evaluator;
2. How to translate the result of a snippet evaluation (an Object or primitive value) to a useful compile-time representation;
3. Relocatable expressions can include unrepeatable dynamic parameters, and these cannot be evaluated at compile time, so how the snippet evaluator performs the implied partial evaluation task.

Runtime Environment for Snippet Evaluation

The program (e.g., Lime) compiler in one embodiment of the present disclosure generates bytecode representations of all user code before running any snippet evaluation. So the snippet evaluator can run with a JVM classpath that includes all the generated bytecode. This classpath reflects the anticipated runtime environment at the granularity of packages and visible classes.

In order to reproduce within-class scoping of names that appear in the expression, the compiler constructs a snippet method which represents a repeatable expression. In one embodiment of the present disclosure, a snippet method has no parameters, and is declared in the class in which the repeatable expression occurs. To build a snippet method, the compiler of the present disclosure in one embodiment may first creates a single return statement with a copy of the expression. That is, if the expression is i+j, then the snippet method starts out as private static int snippetMethod12345( ){return i+j;}

This method will not type-resolve, since i and j are variables with arbitrary bindings. The second step visits all the names in the expression and determines that the correct i and/or j will actually be in scope, or replays the declaration(s) of i or j inside the method. Since all names are resolved at this point, this analysis can be done accurately.

From the definition of repeatability, any qualified names (e.g. b.i) denote static fields. If a name refers to a static repeatable field, then no additional steps are required, since the scope already binds the name. If a simple name refers to a local variable, the compiler in one embodiment of the present disclosure replays the variable declaration inside the snippet method. If a simple name refers to an instance field defined in the encompassing class or one of its supertypes, then the compiler in one embodiment of the present disclosure generates an equivalent local variable declaration in place of the field declaration. When a variable or instance field declaration is replayed, it might trigger transitive replay of other variables or instance fields referenced in the declaration.

The replay strategy is sound for the following reasons. If the snippet is based on a fully repeatable expression, i and j must denote final variables or fields with explicit repeatable initializations. If the expression contains unrepeatable task initializers, they are replaced by placeholders (which have repeatable behavior and don't include name references).

Supporting non-static qualified names may complicate the analysis, e.g., it is far more difficult to replay the sequence of declarations backing such names since some segments represent objects whose creations have already occurred while others are just field references. In general, one might not even have the source for the class that defines the type of the object or in which the object was created.

Interpreting Snippet Evaluation Results

Translating a runtime value back into a compile-time representation is simplified by the fact that repeatable expressions always produce programming language (e.g., Lime) values, which are containment trees with no cycles or internal aliases. Translation from runtime back to a compile-time representation can use any of the following techniques.

Literal: If the value is of a type that has a literal representation, use the literal.

Default: If the value corresponds to the default value of its type, use a standard Lime expression to produce that default value.

Reconstruction: Inspect the value's structure (which is alias-free and acyclic) and build a compile-time representation of that structure for use by later compiler phases.

Otherwise, if the value is an array and its elements can be represented by the previous rules, construct the appropriate array literal.

The present implementation in one embodiment of the present disclosure uses the reconstruction technique for the stream graph structure and uses the literal or default technique or their array generalizations for any repeatable task initializers it finds. Unrepeatable task initializers (and those repeatable ones that can only be encoded by reconstruction) are handled using the technique of the next section (Partial Evaluation). More repeatable task initializers may be handled by reconstruction, yielding more efficient code.

Partial Evaluation

The above defined relocatable expressions so that the stream graph structure was required to be repeatable but task initializers could be unrepeatable. The Repeatable Structure Property allows to use the snippet evaluator for all relocatable expressions, even with some unrepeatable parameters: any legal value of the correct type can be substituted for a dynamic parameter, and the resulting objects from evaluation will have the same stream graph structure. So, in snippet evaluation, an embodiment of the present disclosure may generate a unique placeholder value for each unrepeatable parameter, and run the snippet with an unmodified JVM. In the resulting object, the placeholders may flow to task initialization parameters, but (from the Repeatable Structure Property) cannot affect any other aspect of the computation.

As a result, the evaluated object must have the same stream graph structure as the stream graph that will arise at runtime. The implementation may or may not choose to evaluate repeatable parameters that flow to task initializers. Dynamic parameters will be clearly identified by placeholder values in the resultant stream graph object. When interpreting the resultant stream graph object, the compiler maps placeholder values to the appropriate expressions in the generated code, which causes dynamic parameters to flow to generated tasks at runtime.

As discussed above, a programmer may write programs that build stream graphs for programming a hardware circuit (e.g., FPGA synthesis) using a programming language, e.g., an object oriented programming language, and associated compiler incorporating the above described methodologies. The programming language (an example of which was illustrated with reference to the Lime language), may support stream graph construction using rich abstractions and control flow constructs that comprise conditionals, loops, and recursion. The language permits compact graph construction code using a number of idioms which may be factored into library methods. Graph construction may be parameterized in terms of size via repeatable parameters, and function via tasks as first-class values. The compiler succeeds in extracting the task graphs and synthesizes the code into FPGA circuits.

Such programming language may handle multiple different coding patterns in identifying and extracting stream graphs. Examples of different coding patterns may include:

Recursive: Constructs a graph using recursion. The idiom is useful for constructing a sequence of connected tasks.

Divide and conquer: A form of recursive graph construction for divide and conquer algorithms.

Map: Constructs a multi-task from a single task, and curries the task's vector-position into the task worker method. The map is useful for data- and task-parallel multitasks that operate on partitioned streams.

Repeat: Constructs a multitask from one or more tasks, currying the task's vector-position into the task worker method. Unlike the map idiom where the tasks operate on a partitioned stream, here every task operates on identical values.

Manual: Constructs arbitrary acyclic graphs using the manual task and connect API. The idiom is most useful for irreducible graphs (e.g., butterfly) but is applicable for reducible topologies as well (e.g., reduction tree).

In one embodiment of the present disclosure, the ability to treat stream graphs and tasks as first-class objects may allow to factor the graph construction idioms into library utility methods. Examples are illustrated below.

Recursive

Graphs may be built using a recursive idiom. Table 10 shows an example that builds a sequence of tasks that perform the encryption required by DES. In this sequence, all but the last task behave identically modulo the curried encryption key (a KeySchedule). The last stage performs a bit reversal, indicated by the curried task initializer expression round !=15.

At each level of the recursion, the graph grows by one task. Although it is convenient to express graph construction in this way, it is often easier to create an array of filters and chain them together using a common utility method. This is illustrated in Table 10: makeFilters creates the array and the library method Idioms.pipeline constructs the pipeline.

The graph extracted from ([recursive(new KeySchedule( ) 15)]) is structurally equal to that constructed with the following expression:

([Idioms.<bit>pipeline(makeFilters(new KeySchedule( )))]).

TABLE 10

Recursive graph construction for DES.

```
task Filter<bit[[64]], bit[[64]]> recursive(task KeySchedule keys, int round) {
    if (round == 0)
        return task des.F(keys.lookup(round), true, bit[[64]]);
    else return recursive(keys, round − 1) =>
        task des.F(keys.lookup(round), round != 15, bit[[64]]);
}
local Filter<bit[[64]], bit[[64]]>[[ ]] makeFilters(KeySchedule keys) {
    final coder = new Filter<bit[[64]], bit[[64]]>[16];
    for (int round = 0; round < 16; round++)
        coder[round] = task des.F(keys.lookup(round), round != 15, bit[[64]]);
    return new Filter<bit[[64]], bit[[64]]>[[ ]](coder);
}
public class Idioms {
    static task <V extends Value> Filter<V,V> pipeline(Filter<V,V>[[ ]]
```

TABLE 10-continued

Recursive graph construction for DES.

```
        filters) {
            var pipe = filters[0];
            for (int i = 1; i < filters.length; i++)
                pipe = pipe => filters[i];
                return pipe;
        }
}
```

Divide and Conquer

Divide and conquer extends the recursive idiom with parameterized ordinal types. An example of a library utility is presented which exploits first-class task values with higher-order logic. Table 11 shows a generic method Idioms.dnc parameterized by the type V of the values flowing between tasks and the input size N. This method builds a graph that divides the input recursively until the base case is reached, connects a task t to perform the desired computation, and inserts joiners to combine the results from each level of recursion.

The mergesort benchmark uses this idiom to construct its task graph as in Idioms.<int, 16>dnc(task Merge.sort) where task Merge.sort creates a task to sort a given (merged) array of integers.

The example relies on programming language (Lime) matchers which appear as # in the code. The simplest matchers (as in this example) perform aggregation to convert a stream of V to V[[n]] or deaggregation for the reverse conversion. Lime provides type inference across the connect operator so that the left or right side of the conversion may be omitted.

TABLE 11

Graph construction using divide and conquer.

```
public class Idioms {
    static task <V extends Value, ordinal N> Task dnc(Task t) {
        final HALF = N.size/2;
        if (N.size > 2)
            return (V #) =>
                task split V[[2]] =>
                task [ Idioms.<V, HALF>dnc(t), Idioms.<V,
                  HALF>dnc(t) ] =>
                task join V[[2]] =>
                (# V[[N]]) => t => (# V);
        else return t;
    }
}
```

Map and Repeat

Iterative and recursive construction serve to construct sequences of connected tasks. An alternate idiom uses multitask constructors, which construct vectors of tasks not directly connected to each other.

Table 12 shows an example, drawn from the beamformer benchmark and simplified for exposition. The makeBeams method initializes an array of tasks and then returns the multitask composition of the array elements. The Lime map operator (@) permits a more concise encoding as static task Task makeBeams(int N){return task[@makeBeam(indices(N))];}

The details of the map and indices method are omitted.

Two classes of multitasks may be distinguished: those that operate on partitioned streams and constructed using map, and those that operate on a repeated stream. In the former, a single stream is split and distributed to each of the tasks. In the latter, the values in a stream are repeated k times immediately before the splitter. The end result is that each of the connected tasks observe and operate on the same values.

A library utility method may be implemented called Idioms.repeat that accepts a multitask, and returns a graph having a task that repeats values the required number of times, and connects it to a splitter, multitask and joiner. The example (Table 12) illustrates another feature of matchers (i.e., the repeat count). The matcher repeats every value it consumes N times on every invocation.

TABLE 12

Multitask construction example for map and repeat idioms.

```
public class Beamformer {
    static task Task makeBeams(int N) {
        var beams = new Task[N];
        for (int b = 0; b < N; b++) beams[b] = makeBeam(b);
        return task [ beams ];
    }
    static local Task makeBeam(int id) { return task
        Beamformer.formBeam(id, float); }
    static local float formBeam(int id, float val) { ... }
}
public class Idioms {
    static task <ordinal N, V extends Value> Task
    repeat(Filter<V,V>[[N]] filters) {
        return (V # V[[N]], repeat N.size) =>
            task split V[[N]] => task [ filters ] => task join V[[N]];
    }
}
```

Manual

The preceding examples all exhibit reducible graph topologies. Other topologies may only be expressed with manual connections. These include not only irreducible graphs, but also use cases that are simply easier to express using a richer programmatic interface. A manual connection API supported by a programming language (e.g., the Lime manual connection API) may be provided or used. Using manual connection, library utilities may be created to express a variety of graph shapes. These may include butterfly networks, systolic arrays and reduction trees. In each case, the library utilities establish the desired shape, parameterized by a small number of values, and allow the programmer to pass in tasks as first-class values to connect internally.

A programming language (e.g., Lime)'s properties may be relied on to encapsulate complex manual graph construction algorithms in libraries using higher-order functions, while still enjoying parameterized types and sizes, type safety, and repeatable graph shapes. The ability to write the graph construction code in the same language and semantic domain as the rest of the application also means a single development and debugging environment can be used. This is especially helpful for the construction of irreducible graphs where the code is relatively more complex compared to idioms illustrated above.

A compiler of the programming language (e.g., Lime) may extract relocatable graphs (for hardware synthesis) from a program code (e.g., code patterns examples illustrated above). In one example, the extracted graphs (in Lime code) may be synthesized (by a hardware-specific compiler) into circuits suitable for programming a hardware (e.g., FPGA). In one aspect, a hardware-specific compiler may partition a task graph into the largest non-overlapping sub-graphs, and synthesize each partition independently. In another aspect, an entire extracted graph may be compiled into one large circuit.

The graph extraction and relocation methodologies illustrated herein enable synthesizing task graphs into hardware circuits (e.g., FPGA circuits) from high-level object-oriented code. For instance, the stream graph construction may be embedded in a general purpose object-oriented language. Such language may also support irreducible stream graphs constructed with complex code, which can still be synthesized to an FPGA or the like.

Programming language constructs in one embodiment of the present disclosure can be viewed as binding-time annotations, which specify a division to drive off-line partial evaluation of certain program constructs. The programming language of the present disclosure may support solely off-line specialization. The programming language of the present disclosure may target code generation for devices such as FPGAs, where runtime specialization is not practical with current synthesis technology. The programming language may restrict the relevant code to oblivious expressions amenable to off-line evaluation. In the partial evaluation literature, a program or expression is oblivious if the program always follows the same execution path (in terms of if/then/else or other conditional execution constructs) in every possible execution.

In another aspect, the programming language's binding time annotations may be fully integrated into the type system, which provides safe, modular checking. Additionaly, the programming language may restrict the static division to oblivious code sequences, which can include holes for values, but where dynamic values cannot affect control flow.

Figure 3:
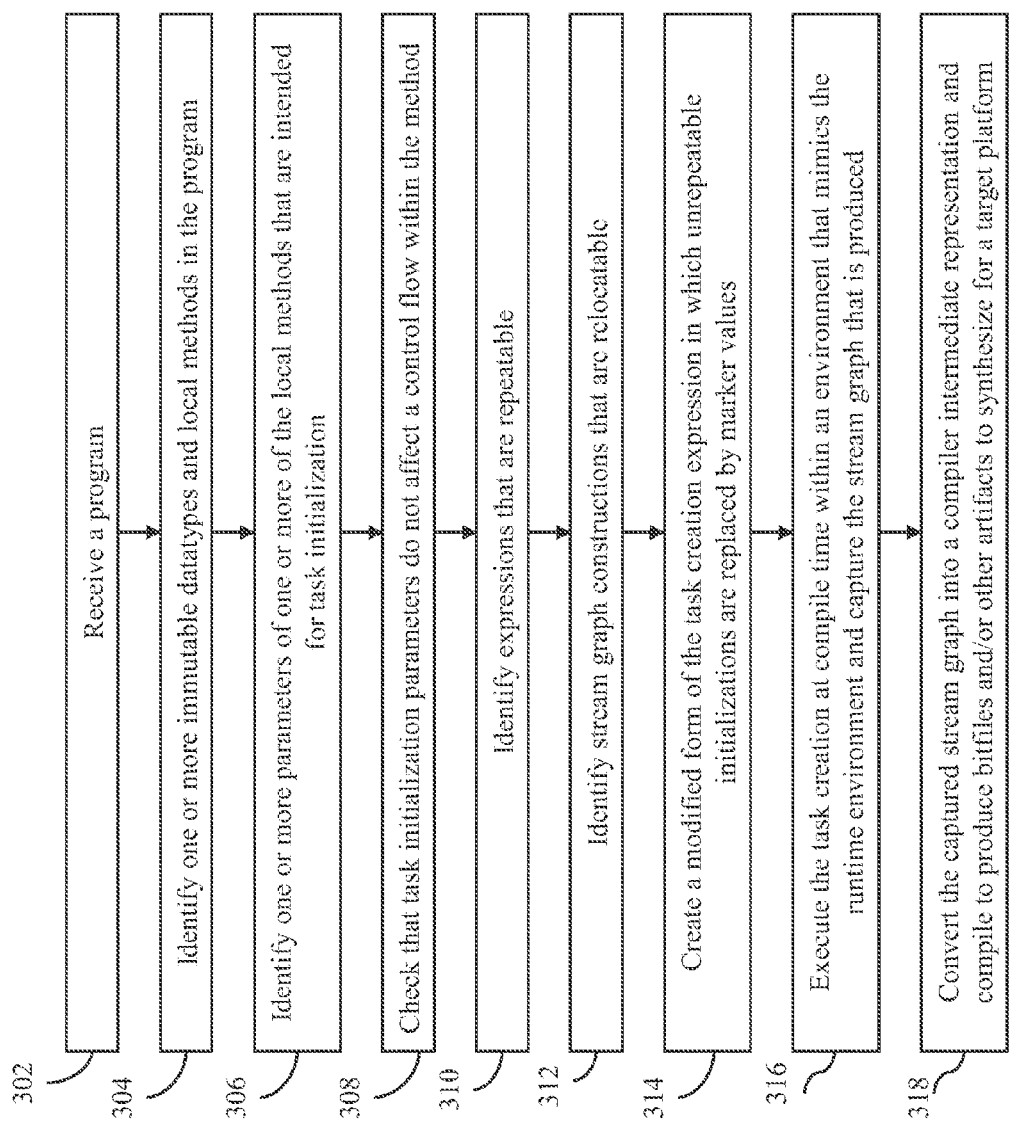
FIG. 3 is a flow diagram illustrating a compiler method in one embodiment of the present disclosure for extracting a stream graph.

FIG. 3 is a flow diagram that illustrates a compiler method of FIG. 1 in more detail, in one embodiment of the present disclosure for extracting a stream graph. At 302, a program is received. A program that is analyzed for stream graph extraction in one embodiment of the present disclosure may be written using language extensions, annotations, or other directives to permit the compiler to perform the processing shown in FIG. 3. As discussed above, the representation of a stream graph in the programming language may include nodes that are immutable and connection operations that are functional (producing a larger subgraph from smaller subgraphs without altering the smaller ones).

At 304, the compiler identifies one or more datatypes in the program that are immutable and one or more methods that are local. For identifying immutable datatypes and/or local methods, techniques described in co-pending and co-owned U.S. patent application Ser. No. 12/870,980, filed Aug. 30, 2010, entitled "EXTRACTION OF FUNCTIONAL SEMANTICS AND ISOLATED DATAFLOW FROM IMPERATIVE OBJECT ORIENTED LANGUAGES," may be used. The content of that application is incorporated herein by reference. Other technique may be used also.

At 306, the compiler also identifies one or more parameters of one or more local methods that are intended for task initialization. Those parameters are also referred to herein as being "dynamic."

At 308, the compiler checks that task initialization parameters are not used in a way that affects a control flow within the method (in which those parameters are used). One example way of checking this, as described above, is to allow them to appear only in stream graph node constructions in positions that syntactically denote them as initializations, with all other uses being disallowed. However, other forms of checking may be employed.

At 310, the compiler identifies expressions that are repeatable, e.g., as defined above. In one aspect, repeatability is defined entirely using immutability and localness as checked at 308.

At 312, the compiler also identifies stream graph constructions that are relocatable. For example, a stream graph construction may be identified as being relocatable if they are built from the nodes that are immutable and connection operations that are functional. A stream graph constructions may be also identified as being relocatable if they are repeatable except for the possible presence of task initializations, which are allowed to be unrepeatable (e.g., see Definition 4 discussed above). In one aspect, a stream graph constructions may be also identified as being relocatable even if the stream graph construction may include calls to unrepeatable local methods, as long as the unrepeatable parts are only passed as task initialization parameters (e.g., see Definition 5 discussed above).

In one embodiment, the compiler may automatically identify all possible relocatable stream graph constructions. In another embodiment, a programmer may identify which subgraphs should be relocated, e.g., by using a predefined annotation in the compiler.

At 314, the compiler creates a modified form of the task creation expression in which unrepeatable initializations are replaced by marker values. For example, a default value for a datatype may be used (e.g., the compiler language such as the Lime language guarantees a default for every value type). However, any method for distinguishing the unrepeatable initializations from the repeatable ones may be used.

At 316, the compiler executes the task creation at compile time within an environment that mimics the runtime environment and captures the stream graph that is produced. Because unrepeatable initializations were marked prior to execution, the markers appear in the result and it is known which initializations are unrepeatable.

At 318, the stream graph captured at 316 is converted into a suitable compiler intermediate representation and compiled to produce the necessary bitfiles and/or other artifacts to synthesize for the target platform, e.g., reconfigurable hardware.

Figure 4:
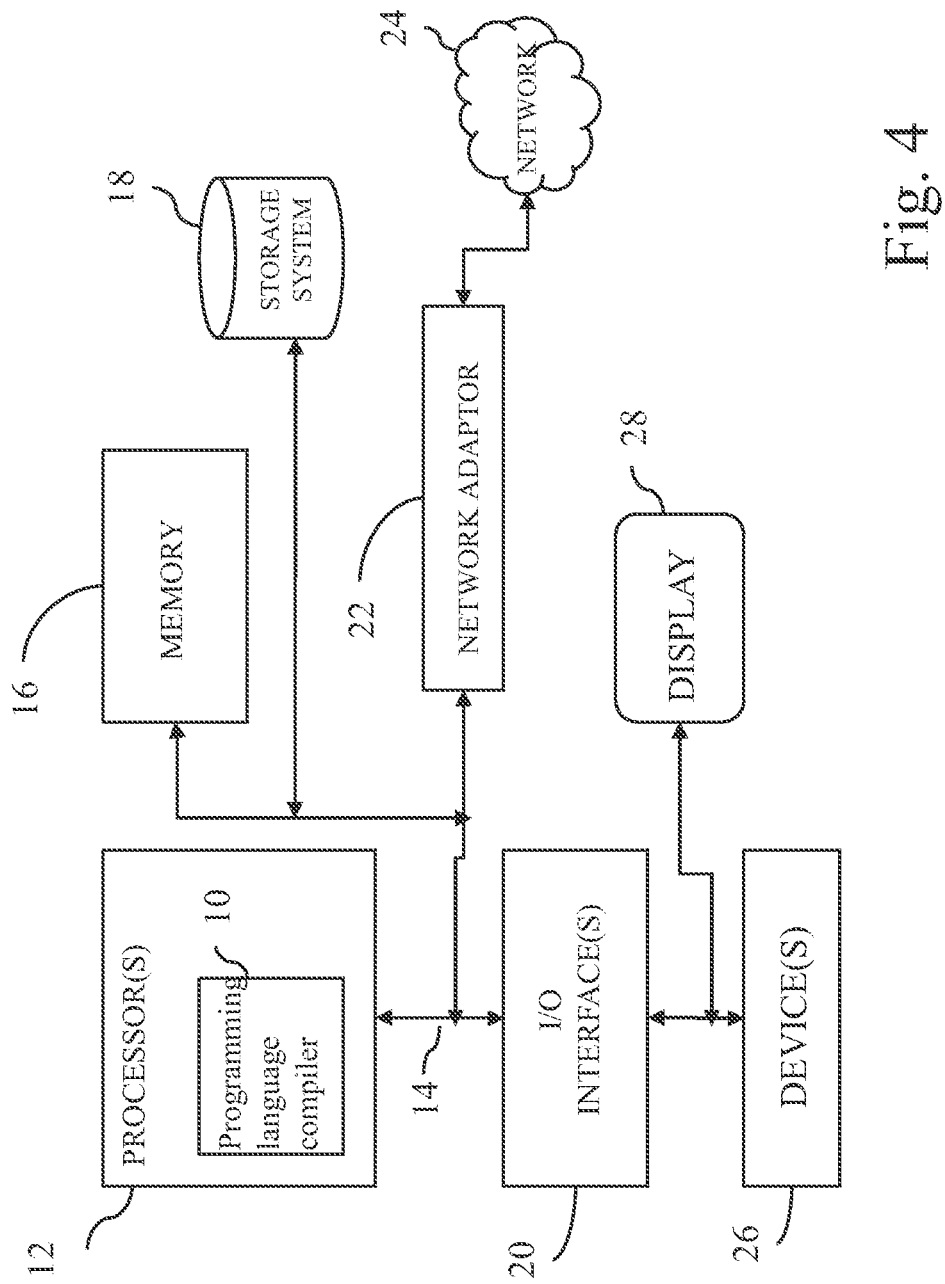
FIG. 4 illustrates a schematic of an example computer or processing system that may implement a programming language compiler system in one embodiment of the present disclosure.

FIG. 4 illustrates a schematic of an example computer or processing system that may implement a compiler system in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 4 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a compiler module 10 that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present invention may be embodied as a system, method or computer program product. Accordingly, aspects of the present invention may take the form of an entirely hardware embodiment, a software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method for extracting a stream graph for a hardware circuit from a program written in a programming language, comprising:

receiving a program;

analyzing the program, by a processor, for one or more constructs in the programming language that builds the stream graph for programming the hardware circuit, a node in the stream graph representing a computation to be performed, the computation expressed in the programming language, an edge in the stream graph representing data flowing from the node to another node in the stream graph; and outputting one or more artifacts representing the stream graph, wherein the stream graph can be compiled for the hardware circuit to execute and produce a result with different node initialization values and different streaming data values that are presented in an execution of the program not known at compile time, the analyzing comprising identifying one or more stream graph constructions that are relocatable, wherein the one or more stream graph constructions are identified as relocatable if the one or more stream graphs constructions are built from one or more immutable nodes and one or more connections that do not alter nodes of the one or more stream graphs.

2. The method of claim 1, wherein the analyzing comprises:

identifying one or more expressions that are repeatable.

3. The method of claim 2, wherein the one or more expressions are identified as being repeatable if the expressions have immutable datatypes.

4. The method of claim 2, wherein the one or more expressions are identified as being repeatable if the expressions are local methods.

5. The method of claim 1, wherein the one or more stream graph constructions are identified as relocatable if computations associated with the one or more stream graph constructions are repeatable.

6. The method of claim 1, wherein the one or more stream graph constructions are identified as relocatable if computations associated with the one or more stream graph constructions are repeatable, except for a presence of one or more task initializations.

7. The method of claim 1, wherein the one or more stream graph constructions are identified as relocatable even if the one or more stream graph constructions include one or more calls to one or more unrepeatable local methods, provided that an unrepeatable part is only passed as one or more task initialization parameters.

8. The method of claim 1, wherein a compiler automatically identifies all relocatable stream graph constructions in the program.

9. The method of claim 1, wherein one or more of relocatable stream graph constructions are identified in the program manually.

10. The method of claim 1, wherein the analyzing comprises creating a modified form of a task creation expression, wherein one or more unrepeatable initializations are replaced by one or more marker values.

11. The method of claim 10, wherein the analyzing further comprises executing the modified form of the task creation expression at compile time within an environment that mimics a runtime environment, and capturing a stream graph that is produced from the executing.

12. The method of claim 11, wherein the analyzing further comprises converting the captured stream graph into the artifacts, the artifacts comprising at least hardware description language to synthesize for the hardware circuit.

13. A system for extracting a stream graph for a hardware circuit from a program written in a programming language, comprising:

a hardware processor;

a programming language compiler operable to execute on the hardware processor and further operable to analyze a program for one or more constructs in the programming language that builds the stream graph for programming the hardware circuit, a node in the stream graph representing a computation to be performed, the computation expressed in the programming language, an edge in the stream graph representing data flowing from the node to another node in the stream graph, the programming language compiler further operable to output one or more artifacts representing the stream graph, wherein the stream graph can be compiled for the hardware circuit to execute and produce a result with different node initialization values and different streaming data values that are presented in an execution of the program not known at compile time, wherein the one or more stream graph constructions are identified as relocatable if the one or more stream graphs constructions are built from one or more immutable nodes and one or more connections that do not alter nodes of the one or more stream graphs.

14. The system of claim 13, wherein the compiler identifies repeatable expressions in the program and identifies one or more relocatable stream graph constructions in the program.

15. The system of claim 14, wherein the one or more stream graph constructions are identified as relocatable even if the one or more stream graph constructions include one or more calls to one or more unrepeatable local methods, provided that an unrepeatable part is only passed as one or more task initialization parameters.

16. A non-transitory computer readable storage medium storing a program of instructions executable by a machine to perform a method of extracting a stream graph for a hardware circuit from a program written in a programming language, the method comprising:

receiving a program;

analyzing the program for one or more constructs in the programming language that builds the stream graph, a node in the stream graph representing a computation to be performed and an edge in the stream graph representing data flowing from the node to another node in the stream graph,; and outputting one or more artifacts representing the stream graph, wherein the stream graph can be compiled for the hardware circuit and is capable of executing and producing a result with different node initialization values and different streaming data values that are presented in an execution of the program not known at compile time, the analyzing comprising identifying one or more stream graph constructions that are relocatable, wherein the one or more stream graph constructions are identified as relocatable if the one or more stream graphs constructions are built from one or more immutable nodes and one or more connections that do not alter nodes of the one or more stream graphs.

17. The non-transitory computer readable storage medium of claim 16, wherein the analyzing comprises:

identifying one or more stream graph constructions that are relocatable.

18. The non-transitory computer readable storage medium of claim 16, wherein the analyzing comprises identifying one or more expressions that are repeatable, wherein the one or more expressions are identified as being repeatable if the expressions have immutable datatypes or if the expressions are local methods, or combinations thereof.

* * * * *